(12) United States Patent
Dixon et al.

(10) Patent No.: US 10,710,496 B2
(45) Date of Patent: Jul. 14, 2020

(54) LIGHTING SYSTEM FOR A VEHICLE HAVING A LIGHT TESTING MODE AND METHOD OF INSPECTING LIGHTS

(71) Applicant: Jaguar Land Rover Limited, Coventry, Warwickshire (GB)

(72) Inventors: Malin Dixon, Coventry (GB); Malith Sumanasekera, Coventry (GB)

(73) Assignee: JAGUAR LAND ROVER LIMITED, Coventry, Warwickshire (GB)

( * ) Notice: Subject to any disclaimer, the term of this patent is extended or adjusted under 35 U.S.C. 154(b) by 324 days.

(21) Appl. No.: 15/556,573

(22) PCT Filed: Mar. 8, 2016

(86) PCT No.: PCT/EP2016/054943
§ 371 (c)(1),
(2) Date: Sep. 7, 2017

(87) PCT Pub. No.: WO2016/142391
PCT Pub. Date: Sep. 15, 2016

(65) Prior Publication Data
US 2018/0043821 A1   Feb. 15, 2018

(30) Foreign Application Priority Data
Mar. 10, 2015 (GB) .................................. 1504055.3

(51) Int. Cl.
*B60Q 1/30* (2006.01)
*B60Q 11/00* (2006.01)
(Continued)

(52) U.S. Cl.
CPC ............ *B60Q 1/305* (2013.01); *B60Q 11/005* (2013.01); *B62D 65/005* (2013.01); *G01R 31/44* (2013.01); *G01R 31/006* (2013.01)

(58) Field of Classification Search
CPC .... B60Q 1/305; B60Q 11/005; B62D 65/005; G01R 31/44; G01R 31/006
See application file for complete search history.

(56) References Cited

U.S. PATENT DOCUMENTS 4,738,133 A * 4/1988 Breckel ................ G01R 31/006
340/870.28
4,866,390 A   9/1989 Butchko
(Continued)

FOREIGN PATENT DOCUMENTS

DE   10 2012 020 033 A1   4/2014

OTHER PUBLICATIONS

Patents Act 1977: Combined Search and Examination Report under Sections 17 and 18(3), GB Application No. GB1504055.3, Sep. 9, 2015, 7 pages.
(Continued)

*Primary Examiner* — Daniel R Miller
(74) *Attorney, Agent, or Firm* — Miller Nash Graham & Dunn LLP (57) ABSTRACT

A vehicle (2) comprises a plurality of vehicle lights (14a-k) to be matched by additional lights (8a-j) in use; respective connecting interfaces (20a-20h) associated with each of the vehicle lights (14a-k); and an electronic controller (24) for controlling supply of light-activating power to the vehicle lights (14a-k) and to the associated connecting interfaces (20a-20h). The controller (24) is configured, in a light testing mode, to supply said power to each of the vehicle lights (14a-k) and to each of the associated connecting interfaces (20a-20h) in a sequence for inspecting whether additional lights (8a-j) connected in use to the connecting interfaces (20a-20h) match the vehicle lights (14a-k). Related systems, methods and controllers are also described.

20 Claims, 6 Drawing Sheets

(51) Int. Cl.
*G01R 31/44* (2020.01)
*B62D 65/00* (2006.01)
*G01R 31/00* (2006.01)

(56) References Cited

U.S. PATENT DOCUMENTS

| | | | |
|---|---|---|---|
| 5,329,204 A * | 7/1994 | Ricca | B60Q 1/1407 |
| | | | 307/10.8 |
| 6,066,951 A | 5/2000 | Maass | |
| 6,674,288 B2 | 1/2004 | Gumbel et al. | |
| 8,947,096 B1 | 2/2015 | Wolf | |
| 2003/0057955 A1 | 3/2003 | Gumbel et al. | |
| 2005/0258948 A1 | 11/2005 | Bolander et al. | |
| 2006/0170427 A1 | 8/2006 | Lahr et al. | |
| 2007/0285100 A1 | 12/2007 | Hart | |
| 2013/0221970 A1 | 8/2013 | Miller et al. | |

OTHER PUBLICATIONS

International Search Report and Written Opinion of the International Searching Authority, International Application No. PCT/EP2016/054943, May 13, 2016, 14 pages.

* cited by examiner

LIGHTING SYSTEM FOR A VEHICLE HAVING A LIGHT TESTING MODE AND METHOD OF INSPECTING LIGHTS

RELATED APPLICATIONS

This application is a 35 U.S.C. § 371 national stage application of PCT Application No. PCT/EP2016/054943, filed on Mar. 8, 2016, which claims priority from Great Britain Patent Application No. 1504055.3, filed on Mar. 10, 2015, the contents of which are incorporated herein by reference in their entireties. The above-referenced PCT International Application was published in the English language as International Publication No. WO 2016/142391 A1 on Sep. 15, 2016.

TECHNICAL FIELD

This present disclosure relates to improvements in light testing and particularly, but not exclusively, to testing of electric lights in vehicles. Embodiments of this invention relate to vehicles facilitating an inspection of additional lights and to a method of providing a light inspection function. Aspects of the invention also relate to a vehicle, a vehicle-trailer combination, a vehicle lighting system, a controller, software and a processor.

BACKGROUND

The connection of a trailer to a motor vehicle brings with it a requirement for additional rear lights. In particular, where the rear lights of the vehicle are obscured, additional lights, commonly referred to as trailer lights, are necessary to provide rear lighting.

A similar requirement can arise when a structure, such as a rack, is mounted to the rear of a motor vehicle. Where the rack obscures rear lights of the vehicle, additional lights, commonly in the form of a light bar, must be provided on the rack.

Additional lights may also be employed at the front of a vehicle. Such additional front lights may, for example, be spot lamps or the like.

Additional lights may be used jointly with vehicle lights or may act as replacements or substitutes for vehicle lights (for example where the vehicle lights are obscured). It can therefore be important that there is a match or correspondence between the vehicle lights and the additional lights. This tends to be particularly crucial in the context of additional rear lights, for example for brake lights or indicators.

Power is generally supplied to additional lights by an electric power supply of the motor vehicle. Accordingly, additional lights are electrically connected to the vehicle. Connection may be achieved in a variety of ways to suit the particular nature of the additional lights and vehicle. Many additional lights, especially additional rear lights, such as trailer lights or a light bar, are temporarily mounted and are therefore connected to the vehicle by an electrical connector that can be readily disconnected, for example a trailer socket.

Given the often temporary nature of additional light connection, and the wide variety of wiring systems that may be employed in additional lights, it is important to inspect additional lights before use to ensure that they match the vehicle lights. This is particularly vital in the context of trailer lights, where wiring may be complex and lights may have failed since the last use of the trailer.

Inspection of additional lights presents the problem that additional lights are often not visible from a vehicle driver's seat from which they are activated in normal use. Brake lights, for example, are lit only while the brake pedal is depressed, which requires a presence in the driver seat. Two people may therefore be required to inspect the lights.

It is known in the art to provide portable light testers for additional lights, in particular trailer lights. Such testers typically comprise a connector for connection to the additional lights, and supply power to selected additional lights on depression of associated buttons to simulate power supplied by a motor vehicle in use. However, such testers are cumbersome and may be ineffective if the additional lights are incorrectly connected to the vehicle after testing.

It is also known in the art to provide circuit testers, which may be mounted between the vehicle and the additional lights. However, while such testers may detect earth faults and the like, they may not detect non-matching additional lights, caused for example by crossed wiring. Such crossed wiring could however have serious effects, for example in the context of indicators.

It is an aim of embodiments of the invention to facilitate convenient and effective inspection of additional lights and/or to address at least one problem associated with the prior art.

SUMMARY OF THE INVENTION

Aspects of the invention relate to a vehicle or vehicle lighting system comprising vehicle lights and interface means for connecting additional lights, wherein in a light testing mode, the vehicle lights and the interface are supplied with power in a sequence for inspecting whether the additional lights match the vehicle lights.

According to one aspect of the invention there is provided a lighting system for a vehicle. The lighting system may comprise a plurality of vehicle lights to be matched by additional lights in use. The lighting system may comprise respective connecting interfaces associated with each of the vehicle lights. The lighting system may comprise an electronic controller for controlling supply of light-activating power to the vehicle lights and to the associated connecting interfaces. The controller may be configured, in a light testing mode, to supply said power to each of the vehicle lights and to each of the associated connecting interfaces in a sequence for inspecting whether additional lights connected in use to the connecting interfaces match the vehicle lights.

Due to the supply of power to the vehicle lights and respective connecting interfaces during the sequence, users are able to inspect whether additional lights connected in use to the connecting interfaces match the vehicle lights, i.e. whether there is a correspondence when jointly lighting up the vehicle lights and the additional lights. Since power is supplied by the controller in the light testing mode, there is no requirement for a presence in the driver's seat. Accordingly, the inspection can be performed by a single person.

The inspection may reveal, for example that some of the additional lights are not working, or that some of the additional lights have been incorrectly wired or connected. Road safety may thus be enhanced significantly.

Contrary to prior art light testers, inspection of additional lights is enabled in an in-situ state, i.e. after the additional lights have been connected. Possible faults occurring as part of the connection process can thus be detected.

The vehicle lights and additional lights are electric lights (lamps). The power supplied to the lights is derived from an electric power source, such as a vehicle battery. Thus the system may comprise a power source for powering the lights.

The connecting interfaces associated with each of the vehicle lights are electric connecting interfaces. The electric connecting interfaces may be of any type suitable for connection to additional lights.

Additional lights may be of any desired type, e.g. front lights, rear lights, or lights mountable anywhere else on a vehicle or ancillary structure. Non-limiting examples of additional lights include headlights, spotlights, fog lights, cornering lights, indicator lights, sidelights, brake lights, and reversing lights, or any combination thereof.

In an embodiment, the additional lights may comprise or consist of additional rear lights. As aforesaid, matching of additional lights tends to be particularly important in the context of additional rear lights.

Suitably, the additional lights may comprise or consist of trailer lights or rear light bar lights. Trailer lights or rear light bar lights typically comprise a set of additional lights including at least left and right indicator lights, sidelights and brake lights. For example in the UK trailers must have on the back two red sidelights, two red brake lights, an illuminated number plate and two triangular red reflectors, plus amber indicators designed to flash between 60 and 120 times per minute. Trailers more than 1.3 m wide must also comprise a red fog light.

The additional lights may form part of the system. The additional lights may suitable by supported on a rack or other auxiliary structure, such as a trailer (i.e. a towed structure).

Conveniently, the connecting interfaces may each comprise an electrical connector. The electrical connector may, for example be a male-ended or a female-ended connector. In an embodiment, the connecting interfaces form part of a socket or a plug, for example a vehicle tow bar socket or plug.

To facilitate inspection, the sequence may advantageously comprise supply of said power to a vehicle light, concurrently with supply of said power to the associated connecting interface.

In this manner any connected additional light is lit up at the same time as the vehicle light, enabling easy determination of correspondence. Suitably, the sequence may comprise supply of said power to each of said vehicle lights, concurrently with supply of said power to the associated connecting interfaces. In this manner easy determination of correspondence can be provided for all additional lights.

To allow a poor earth-connection to be detected, evidenced by an overall reduction in the intensity of illumination of lights, the sequence may advantageously comprise concurrent supply of said power to all of the vehicle lights and associated connecting interfaces, such that all of said vehicle lights and their associated connecting interfaces are supplied with said power during at least one period in the sequence.

For high accuracy of inspection, the sequence may comprise sequential supply of said power to said vehicle lights, such that a subset or one only of said vehicle lights and its associated connecting interface is supplied with said power during at least one period in the sequence. In this manner correspondence is always clear on inspection.

In an embodiment, the sequence comprises sequential supply of power to a plurality of subsets of vehicle lights and associated connecting interfaces, so that each subset and its associated connecting interface only is supplied with said power during at least one period in the sequence. In an embodiment, the sequence may comprise sequential supply of power to said vehicle lights and associated connecting interfaces so that each vehicle light and its associated connecting interface only is supplied with said power during at least one period in the sequence.

In an embodiment, the vehicle lights constitute left and right groups and the sequence comprises sequential activation of the left and right groups of vehicle lights. This may facilitate positioning of an observer during inspection, particularly where left and right groups of additional lights are relatively far apart, or where the view of vehicle lights is substantially obscured, e.g. by a trailer such as a caravan.

Accuracy of inspection may be a particular challenge where lights are close together. Differentiation of adjacent or overlapping lights may advantageously be facilitated by the sequence in this context. In an embodiment, the plurality of vehicle lights (and/or plurality of additional lights) comprises first and second adjacent or overlapping lights and the sequence comprises an interval between supply of said power to the first and second lights. Non-limiting examples of adjacent or overlapping lights may be sidelights and brake lights. In this particular non-limiting example inspection may be a particular challenge because the sidelights and brake lights have the same or similar colour hue but are distinguishable one from the other by illumination intensity. In an embodiment, the first and second adjacent lights are overlapping lights, for example lights sharing a twin filament bulb.

The interval may be a localised interval, i.e. wherein the sequence comprises supply of light-activating power to a third, non-adjacent light during the interval.

The sequence is beneficial in that, for example, it separates the period for the tail lights, which are dim and red, from the periods for the brake lights and the fog lights, which are both bright and red, by the periods for the right indicator and reverse light, neither of which are red.

Alternatively, the interval may be an absolute interval. In an embodiment, the sequence comprises an interval in which no light-activating power is supplied to the vehicle lights or connecting interfaces. One or more such intervals can greatly facilitate inspection. In an embodiment the sequence comprises an interval after supply of light-activating power to each said vehicle light respectively.

Accordingly, the sequence is advantageous for use with vehicles configured for North American markets in that the period for the tail lights, which are dim and red, is separated from the periods for the right turn signal and for all lights (which include bright red lights) by periods for no light. Alternatively, periods wherein the reverse light is illuminated (i.e. not a red light) may interpose the period for the tail lights and the period for the turn signal(s) or that for all lights.

Intervals in the sequence may be of any suitable length. In an embodiment, the interval is at least 0.5 seconds, for example at least 1 second.

Advantageously, the controller may be configured to repeat the sequence as long as the light testing mode remains active. This facilities completion of the inspection, which may not always be possible for users without repetition of the sequence.

The controller may be configured to repeat the sequence until a set time limit.

The controller may be configured to receive information relating to one or more activity-preserving or deactivating conditions from a vehicle.

For vehicular safety, the controller may be configured to keep the light testing mode active in dependence on one or more activity-preserving conditions. Suitably the activity-preserving conditions may comprise one or more of: vehicle stationary, parking brake on, ignition off, vehicle exterior lights off, hazard lights off, and time limit unexpired.

Similarly, the controller may be configured to deactivate the light testing mode in dependence on one or more deactivating conditions. Suitably, the deactivating conditions may comprise one or more of: vehicle movement, parking brake off, ignition on, vehicle exterior lights on, hazard lights on, and time limit expired.

Conveniently, the vehicle may comprise a user interface for activating the light testing mode. Suitably the user interface may comprise a button or other input. In an embodiment, the user interface is located in a vehicle console. In an embodiment, the user interface is located in a boot of the vehicle. Of course interfaces may be provided in more than one location.

The system may comprise a plurality of said additional lights each connected to an associated one of the connecting interfaces of the vehicle such that supply of light-activating power to the connecting interfaces lights up the associated additional light.

The electronic controller may be of any suitable type. Conveniently, the controller may be a body control module of the vehicle. The controller controls supply of light-activating power from an electric power source, such as a vehicle battery.

Any controller or controllers described herein may suitably comprise a control unit or computational device having one or more electronic processors. Thus the vehicle may comprise a single control unit or electronic controller or alternatively different functions of the controller may be embodied in, or hosted in, different control units or controllers. As used herein the term "controller" or "control unit" will be understood to include both a single control unit or controller and a plurality of control units or controllers collectively operating to provide any stated control functionality. To configure a controller, a suitable set of instructions may be provided which, when executed, cause said control unit or computational device to implement the control techniques specified herein. The set of instructions may suitably be embedded in said one or more electronic processors. Alternatively, the set of instructions may be provided as software to be executed on said computational device. A first controller may be implemented in software run on one or more processors. One or more other controllers may be implemented in software run on one or more processors, optionally the same one or more processors as the first controller. Other suitable arrangements may also be used.

According to another aspect of the invention there is provided a controller for controlling supply of light-activating power to a plurality of vehicle lights to be matched by additional lights in use and to respective connecting interfaces associated with each of the vehicle lights, the controller being configured, in a light testing mode, to initiate supply of said power to each of the vehicle lights and to each of the associated connecting interfaces in a sequence for inspecting whether additional lights connected in use to the connecting interfaces match the vehicle lights. Optional features, for example relating to the vehicle lights, additional lights, connecting interfaces, controller, light testing mode, or sequence, may be, for example, as described herein in respect of other aspects or embodiments of the invention.

The controller may suitably be configured for controlling supply of light-activating power to the vehicle lights and associated connecting interfaces in a system according any aspect or embodiment of the invention described herein.

According to still another aspect of the invention there is provided a vehicle or vehicle-trailer combination comprising a lighting system according to any aspect or embodiment of the invention described herein. The vehicle may in particular be a motor vehicle. Suitably, there may be provided a vehicle-trailer combination, wherein the vehicle comprises a lighting system according to any aspect or embodiment of the invention described herein, and wherein the trailer comprises a plurality of (said) additional lights each connected to an associated one of the connecting interfaces of the system such that supply of light-activating power to the interface lights up the associated additional light.

According to yet another aspect of the invention there is provided a method of providing a light inspection function in a lighting system for use or when used in a vehicle, the lighting system comprising a plurality of vehicle lights to be matched by additional lights in use and respective connecting interfaces associated with each of the vehicle lights, the method comprising: supplying light-activating power to each of the vehicle lights and to each of the associated connecting interfaces in a sequence for inspecting whether additional lights connected in use to the connecting interfaces match the vehicle lights. Optional features, for example relating to the vehicle lights, additional lights, connecting interfaces, controller, light testing mode, or sequence, may be, for example, as described herein in respect of other aspects or embodiments of the invention.

According to a further aspect of the invention there is provided a method of inspecting lights, the method comprising: activating, in a lighting system according to any aspect or embodiment of the invention described herein, said light testing mode and a sequence for inspecting whether additional lights connected in use to the connecting interfaces match the vehicle lights; and comparing the activation of the vehicle lights with activation of the additional lights.

The methods of the invention may be computer implemented. According to a further aspect of the invention there is provided a carrier medium carrying computer readable code for controlling a vehicle to carry out any of the methods described herein as aspects or embodiments of the invention. According to yet another aspect of the invention there is provided a computer program executable on a processor so as to implement any of the methods described herein as aspects or embodiments of the invention. According to still another aspect of the invention there is provided a computer readable medium loaded with such a computer program. According to yet still another aspect of the invention there is provided a processor arranged to implement the methods or the computer program.

Throughout the description and claims of this specification, the words "comprise" and "contain" and variations of the words, for example "comprising" and "comprises", mean "including but not limited to", and do not exclude other components, integers or steps. Moreover the singular encompasses the plural unless the context otherwise requires: in particular, where the indefinite article is used, the specification is to be understood as contemplating plurality as well as singularity, unless the context requires otherwise.

Optional features of each aspect of the invention may be as described in connection with any of the other aspects. Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1A:
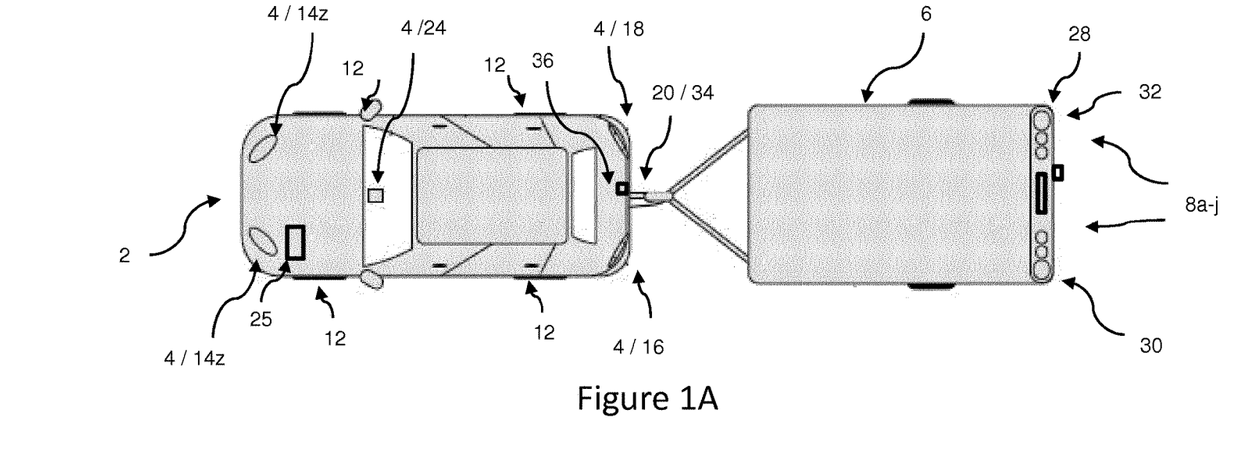
FIG. 1A is a top view of a vehicle comprising a vehicle lighting system according to one embodiment of the invention, with a trailer having a trailer lighting system connected to the vehicle lighting system, in accordance with an embodiment of the invention.

With reference to FIG. 1A, in an embodiment of the invention, a motor vehicle 2 comprises a lighting system 4 electrically connected with a trailer 6 having a plurality of additional lights 8a-j. The trailer 6 is also hitched to the vehicle 2 for towing.

The vehicle 2 comprises a powertrain, including four wheels 12, for driving the vehicle 2 and towing the trailer in use.

Figure 1B:
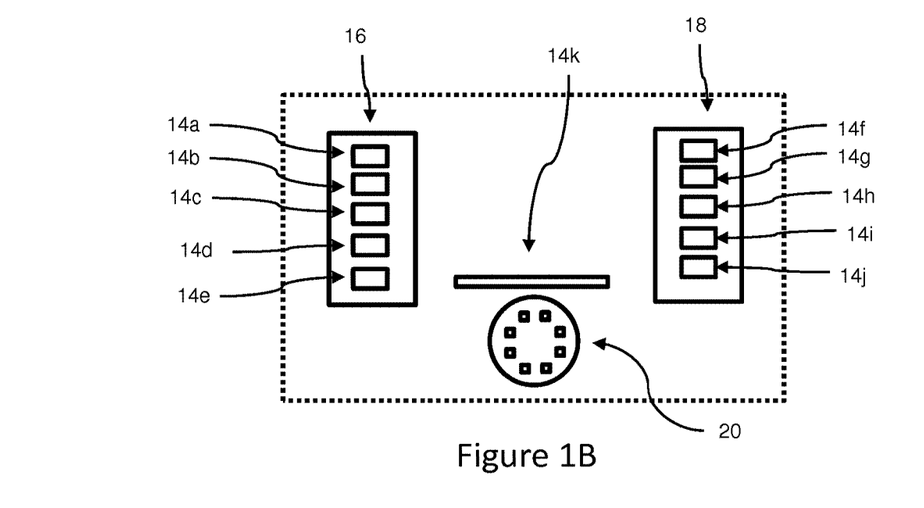
FIG. 1B is a schematic view of rear lights and a tow-bar socket of the vehicle of FIG. 1A.

The lighting system 4 comprises vehicle lights 14a-k arranged on the vehicle in conventional fashion. Referring now additionally to FIG. 1B, the lighting system comprises front lights 14z and left and right sets of rear lights 16, 18.

The left set 16 of rear vehicle lights 14a-e comprises a left brake light 14a, a left indicator light 14b, a left sidelight 14c, a reverse light 14d and a fog light 14e. The right set 18 of rear vehicle lights 14f-j comprises a right brake light 14f, a right indicator light 14g, a right sidelight 14h, a reverse light 14i and a fog light 14j. A central number plate light 14k is positioned between the left and right sets of lights 16, 18.

Figure 1C:
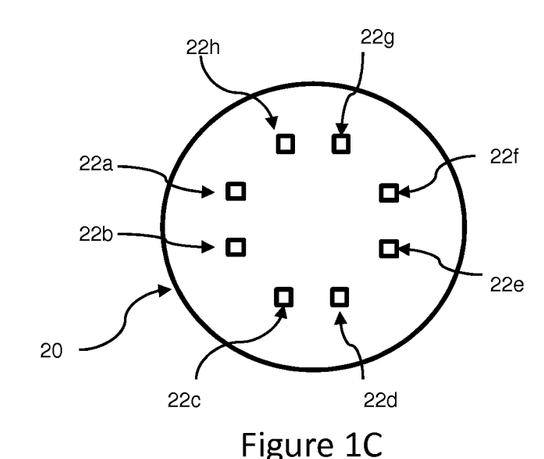
FIG. 1C is a schematic view of a tow-bar socket of the vehicle of FIG. 1A.

Referring now to FIG. 1C, to enable electrical connection with the trailer 6, the lighting system 4 comprises a tow-bar socket 20 having a plurality of connecting interfaces 22a-h. Each of the connecting interfaces is associated with one or more of the rear vehicle lights 14a-k. In particular, the vehicle tow bar socket 20 comprises a left indicator interface 22a, a right indicator interface 22b, a brake light interface 22c, a left sidelight interface 22d, a right sidelight interface 22e, a reverse light interface 22f, an earth interface 22g and a fog light interface 22h.

Supply of light-activating power to the lights 14a-k of the lighting system 4 and to the interfaces 22a-h of the tow-bar socket 20 is controlled by a controller 24 of the system 4. Any controller or controllers described herein may suitably comprise one or more control units or computational devices having one or more electronic processors. In this embodiment, the controller 24 is an electronic body controller of the vehicle 2.

Figure 2:
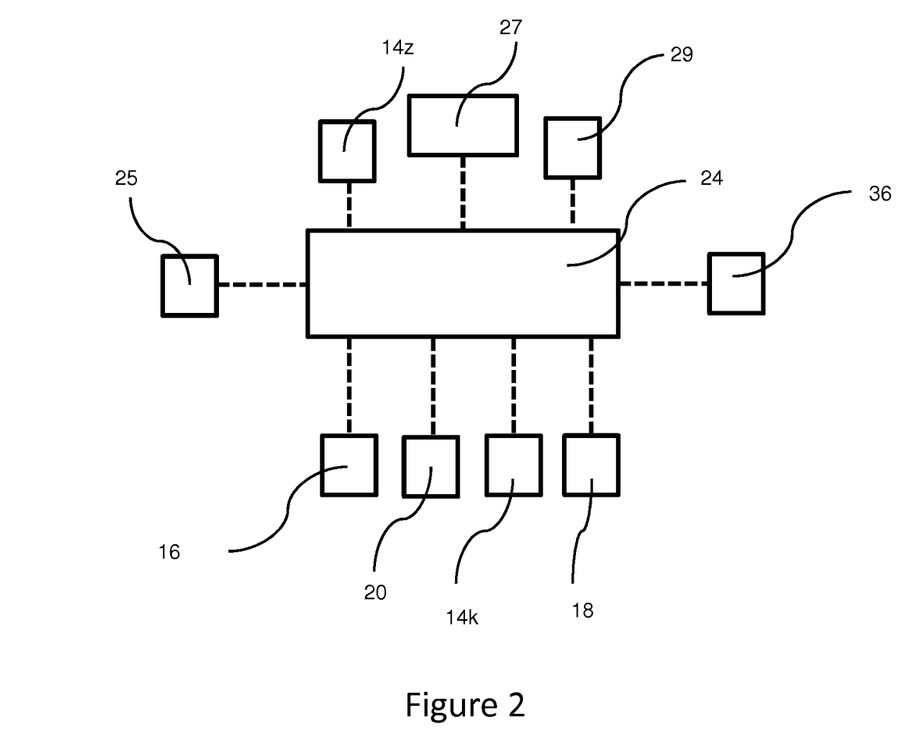
FIG. 2 is a schematic diagram of the vehicle lighting system of the vehicle of FIG. 1A.

Referring now to FIG. 2, the controller 24 is electrically connected to the motor vehicle's battery 25, which functions as a power supply. The controller 24 is configured with suitable software to supply light-activating power sourced from the battery 25 to the front lights 14z of the vehicle 2, the left and right sets of rear vehicle lights 16, 18, the rear number plate light 14k, and the tow-bar socket 20. A display 27 is connected to the controller to inform users of one or more of such light activations. Components and wiring are shown schematically in FIG. 2 and may be arranged in any suitable manner.

As is conventional, the controller 24 supplies light-activating power to the tow-bar socket 20, in particular to the individual connecting interfaces thereof, in correspondence with the associated vehicle lights 14a-k. For example, light-activating power is supplied to the left indicator interface 22a of the socket 20 concurrently with the left indicator vehicle light 14b and to the right indicator interface 22b of the socket concurrently with the right indicator vehicle light 14g. The controller 24 is configured to supply light-activating power in dependence on commands received from other systems 29 of the vehicle, for example in dependence on headlight or indicator switch position.

Figure 1D:
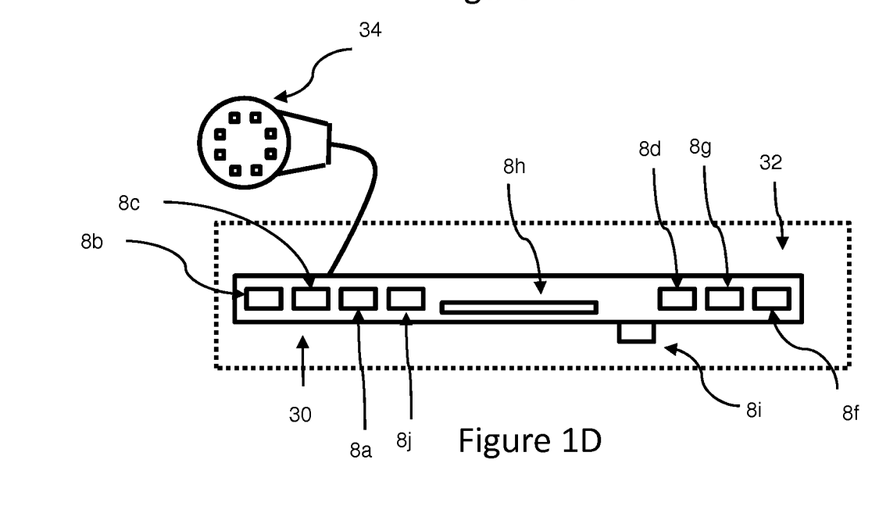
FIG. 1D is a schematic view of the rear lights and a connecting plug of the trailer of FIG. 1A.

Referring now to FIG. 1D, the additional lights 8a-j of the trailer are arranged at a rear end 28 of the trailer 6 in conventional fashion. The trailer 6 comprises left and right sets of rear lights 30, 32.

The left set of rear additional lights 30 comprises a left brake light 8a, a left indicator light 8b, and a left sidelight 8c and a reversing light 8j. The right set of rear additional lights 32 comprises a right brake light 8d, a right indicator light 8f, and a right sidelight 8g. A central number plate light 8h is positioned between the left and right sets of lights 30, 32, as is a fog light 8i.

Notwithstanding the above, the informed reader will readily appreciate that various alternative trailer light arrangements are possible, for example, number plate lights may be part of sidelights, brake and sidelights can be combined, additional central brake lights can be present, there can be one or two reverse lights and one or two fog lights.

The vehicle lights 14a-k are to be matched by the additional lights 8a-j in use. Accordingly, the additional lights 8a-j are wired to a trailer plug 34, which is co-operable with the tow-bar socket 20 to connect the additional lights 8a-j to the appropriate connecting interfaces 22a-h.

Advantageously, the lighting system 4 of the vehicle 2 is configured to operate in a light testing mode. The system comprises a user interface, in the form of a trailer light test button 36 near the tow-bar socket 20 of the vehicle, with which the controller 24 can be switched by a user into a light testing mode. In the light testing mode the controller 24 is configured to supply light-activating power to each of the vehicle lights 14a-k, 14z and to each of the associated connecting interfaces 22a-h in a sequence for inspecting whether the additional lights 8a-j connected to the connecting interfaces match the vehicle lights 14a-k, 14z, as will be described.

Figure 3:
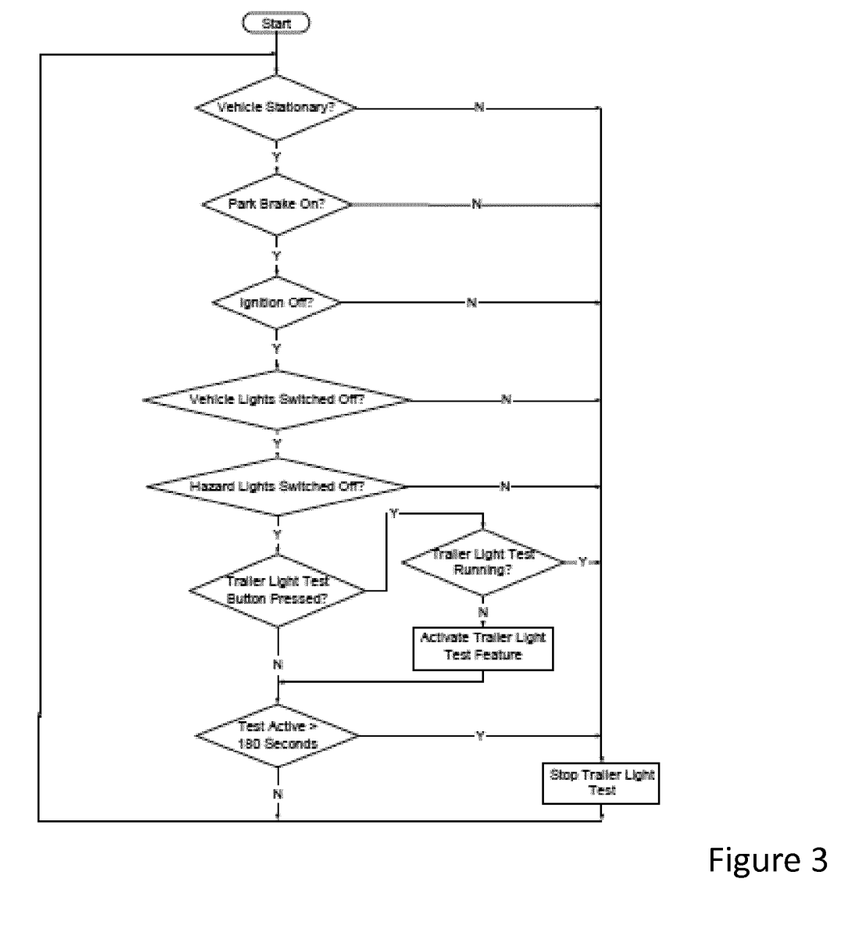
FIG. 3 is a flow-chart detailing a light test mode of the vehicle of FIG. 1.

The light testing mode can be activated, and remains active, only under certain conditions. With reference to FIG. 3, the controller 24 checks with appropriate vehicle systems 29 to confirm that (i) the vehicle is stationary, (ii) the park brake is on, (iii) the ignition is off, (iv) the vehicle lights are switched off, and (v) hazard lights are switched off. If any of these requirements is not met then the light testing mode is not activated (or deactivated if running). There is also a 180 second time limit on the light testing mode, after which it is deactivated until the button 36 is pressed again.

The controller 24 activates the vehicle lights 14a-k, 14z, and associated connecting interfaces in the tow-bar socket 22a-h as follows, while the light testing mode is active:

| Sequence No | Activated light(s)/tow-bar socket interface(s) |
| --- | --- |
| 1 | All lights |
| 2 | Left Indicator |
| 3 | Brake |
| 4 | Right Indicator |
| 5 | Sidelights/Number-plate light |
| 6 | Reverse lights |
| 7 | Fog lights |

Each circuit is operated for 1.5 seconds.

Due to the supply of power to the vehicle lights 14a-k, 14z and respective connecting interfaces 22a-h during the sequence, users are able to inspect whether the additional lights 8a-j connected in use to the connecting interfaces 22a-h match the vehicle lights 14a-k, i.e. whether there is a correspondence when jointly lighting up the vehicle lights and the additional lights. Since power is supplied by the controller 24 in the light testing mode, there is no requirement for a presence in the driver's seat. Accordingly, the inspection can be performed by a single person.

The inspection may reveal, for example that some of the additional lights are not working, or that some of the additional lights have been incorrectly wired or connected. Road safety may thus be enhanced significantly.

Contrary to prior art light testers, inspection of additional lights is enabled in an in-situ state, i.e. after the additional lights have been connected. Possible faults occurring as part of the connection process can thus be detected.

The described sequence is convenient and effective. However, it will be appreciated that the controller 24 may additionally or alternatively be programmed with other light testing sequences without departing from the scope of the invention. For example and without limitation, an interval could be provided between each activation, the length of the sequence extended or shortened, or the button 36 may be placed elsewhere.

Figure 4A:
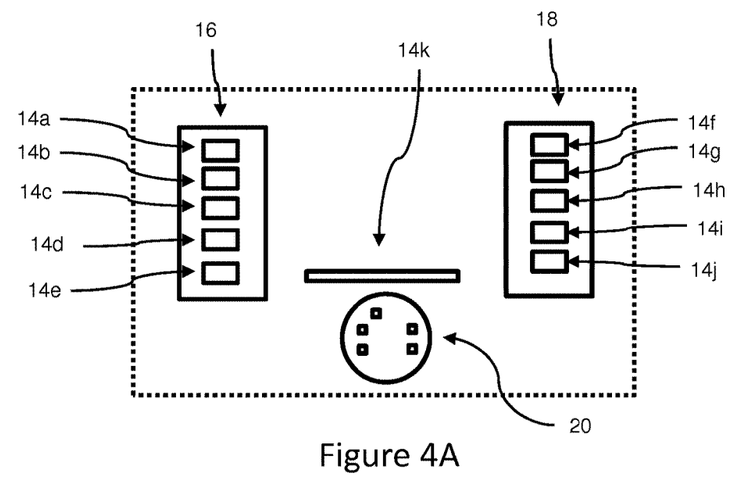
FIG. 4A is a schematic view of rear lights and a tow-bar socket of a vehicle according to another embodiment of the invention configured for the North American market.

By way of further example, in another embodiment of the invention illustrated schematically in FIG. 4A, the vehicle 2 and tow-bar socket 20 may be configured for the North American market, comprising the following lights interfaces: The left set 16 of rear vehicle lights 14a-e comprises a left brake light 14a, a left indicator light 14b, a left sidelight 14c, a reverse light 14d and a fog light 14e. The right set 18 of rear vehicle lights 14f-j comprises a right brake light 14f, a right indicator light 14g, a right sidelight 14h, a reverse light 14i and a fog light 14j. A central number plate light 14k is positioned between the left and right sets of lights 16, 18.

Figure 4B:
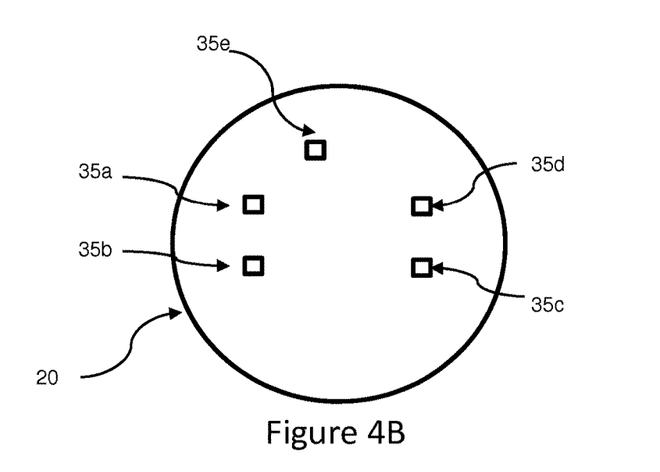
FIG. 4B is a schematic view of the tow-bar socket of FIG. 4A.
Figure 4C:
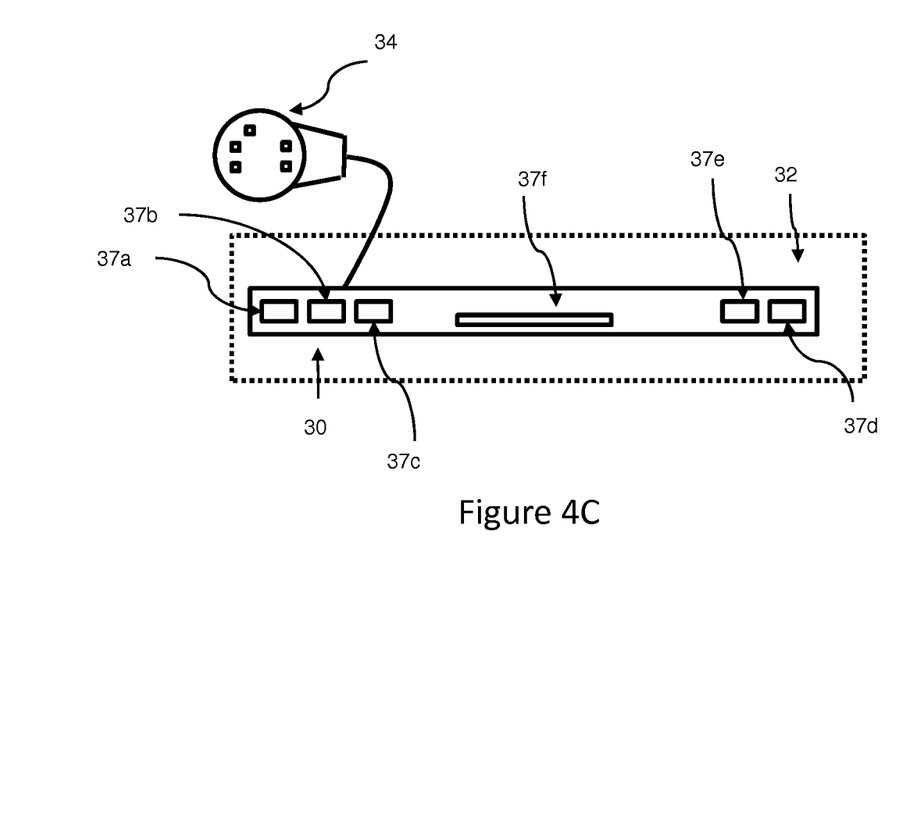
FIG. 4C is a schematic view of the rear lights and a connecting plug of a trailer configured for the North American market.

Referring to FIG. 4C, the left set of rear additional lights 30 comprises a left turn signal/brake light 37a, a left sidelight 37b and a reversing light 37c. The right set of rear additional lights 32 comprises a right turn signal/brake light 37d, and a right sidelight 37e. A central number plate light 37f is positioned between the left and right sets of lights 30, 32.

Referring to FIG. 4B, to enable electrical connection with the trailer 6, the lighting system 4 comprises a tow-bar socket 20 having a plurality of connecting interfaces 35a-e. Each of the connecting interfaces is associated with one or more of the rear vehicle lights 14a-k. In particular, the vehicle tow bar socket 20 comprises a left turn signal/brake light interface 35a, a right turn signal/brake light interface 35b, a sidelight interface 35c, a reverse light interface 35d, and an earth interface 35e.

In such an embodiment, which could otherwise be identical to the embodiment hereinabove described, the controller 24 may suitably activate the vehicle lights, and associated connecting interfaces in the tow-bar socket as follows, while the light testing mode is active:

| Sequence No | |
| --- | --- |
| 1 | All lights |
| 2 | Left turn signal/brake |
| 3 | Right turn signal/brake |
| 4 | Reverse |
| 5 | Tail/Marker |
| 6 | (no light) |

Again each circuit/interval is operated for 1.5 seconds.

Notably this sequence has a period with no lights lit so that the red tail/marker lights period is separated temporally from any period which causes another red light to be lit.

Notably the preferred towing socket for North America has a single interface for turn signal and brake light for each side of the trailer, and predominantly on one side of a trailer the same lamp is used for both functions. There is one test period in the sequence for each interface. During this period, one or more of the vehicle lamps corresponding to the interface functions shall be lit, and no vehicle lamp corresponding to other functions shall be lit.

By way of example, where the vehicle has separate brake lights and direction indicators, at the point in the sequence that the left turn signal/brake interface is activated, either or both the vehicle left brake light or direction indicator will be lit, but no lights on the right hand side of the car will be lit.

Other modifications and sequences falling within the ambit of the invention defined in the appended claims will be apparent to those skilled in the art.

Further aspects and embodiments of the present invention are set out in the following series of numbered paragraphs:

1. A lighting system for a vehicle, the lighting system comprising: a plurality of vehicle lights to be matched by additional lights in use; respective connecting interfaces associated with each of the vehicle lights; an electronic controller having an electrical input; and an electronic memory device electrically coupled to the electronic controller and having instructions stored therein, wherein the electronic controller is configured to access the memory device and execute the instructions stored therein such that it is operable to control supply of light-activating power to the vehicle lights and to the associated connecting interfaces and, in a light testing mode, to supply said power to each of the vehicle lights and to each of the associated connecting interfaces in a sequence for inspecting whether additional lights connected in use to the connecting interfaces match the vehicle lights.
2. A system as described in paragraph 1, wherein the connecting interfaces form part of a socket or plug.
3. A system as described in paragraph 1 or paragraph 2, wherein the sequence comprises supply of said power to each of said vehicle lights, concurrently with supply of said power to the associated connecting interfaces.
4. A system as described in any one of paragraphs 1 to 3, wherein the sequence comprises concurrent supply of said power to all of the vehicle lights and associated connecting interfaces, such that all of said vehicle lights and their associated connecting interfaces are supplied with said power during at least one period in the sequence.
5. A system as described in any one of paragraphs 1 to 4, wherein the sequence comprises sequential supply of said power to said vehicle lights, such that a subset or one only of said vehicle lights and its associated connecting interface is supplied with said power during at least one period in the sequence.
6. A system as described in any one of paragraphs 1 to 5, wherein the vehicle lights constitute left and right groups in use and the sequence comprises sequential activation of the left and right groups of vehicle lights.
7. A system as described in any one of paragraphs 1 to 6, wherein the plurality of vehicle lights comprises first and second adjacent or overlapping lights and the sequence comprises an interval between supply of said power to the first and second lights.
8. The system of paragraph 7, wherein the sequence comprises supply of light-activating power to a third, non-adjacent light during the interval.
9. A system as described in any one of paragraphs 1 to 8, wherein the sequence comprises an interval in which no light activating power is supplied to the vehicle lights or connecting interfaces.
10. A system as described in any one of paragraphs 1 to 9, wherein the controller is configured to repeat the sequence as long as the light testing mode remains active.
11. A system as described in any one of paragraphs 1 to 10, wherein the controller is configured to deactivate the light testing mode in dependence on one or more deactivating conditions selected from: vehicle movement, parking brake off, ignition on, vehicle exterior lights on, hazard lights on, and time limit expired.
12. A system as described in any one of paragraphs 1 to 11 comprising a user interface for activating the light testing mode.
13. A system as described in any one of paragraphs 1 to 12 comprising a plurality of additional lights each connected to an associated one of the connecting interfaces of the system such that supply of light-activating power to the interface lights up the associated additional light.
14. An electronic controller having an electrical input; and an electronic memory device electrically coupled to the electronic controller and having instructions stored therein, wherein the electronic controller is configured to access the memory device and execute the instructions stored therein such that it is operable to control supply of light-activating power to a plurality of vehicle lights to be matched by additional lights and to respective connecting interfaces associated with each of the vehicle lights, and, in a light testing mode, to initiate supply of said power to each of the vehicle lights and to each of the associated connecting interfaces in a sequence for inspecting whether additional lights connected in use to the connecting interfaces match the vehicle lights.
15. A vehicle or vehicle-trailer combination comprising a lighting system according to paragraph 1.
16. A method of providing a light inspection function in a lighting system for use or when used in a vehicle, the lighting system comprising a plurality of vehicle lights to be matched by additional lights in use and respective connecting interfaces associated with each of the vehicle lights, the method comprising: supplying light-activating power to each of the vehicle lights and to each of the associated connecting interfaces in a sequence for inspecting whether additional lights connected in use to the connecting interfaces match the vehicle lights, wherein the sequence comprises supply of said power to a vehicle light, concurrently with supply of said power to the associated connecting interface and wherein the sequence comprises sequential supply of said power to said vehicle lights, such that a subset or one only of said vehicle lights and its associated connecting interface is supplied with said power during at least one period in the sequence.
17. A method according to paragraph 16, wherein the plurality of vehicle lights comprises first and second adjacent or overlapping lights and the sequence comprises an interval between supply of said power to the first and second lights.
18. A carrier medium carrying computer readable code for controlling a vehicle to carry out the method of paragraph 16.
19. A computer program executable on a processor so as to implement the method of paragraph 16.
20. A non-transitory computer readable medium loaded with a computer program according to paragraph 19.

The invention claimed is:
1. A lighting system for a vehicle, the system comprising:
a plurality of vehicle lights, including a group of at least three adjacent or overlapping lights;
a plurality of connecting interfaces, each one of the plurality of connecting interfaces associated with a respective one of the plurality of vehicle lights; and
an electronic controller that controls supply of light-activating power to the plurality of vehicle lights and to the associated plurality of connecting interfaces, wherein the controller is further configured, in a light testing mode, to supply the light-activating power to each one of the plurality of vehicle lights and to an associated connecting interface during a respective period of a sequence for inspecting whether additional lights connected in use to the plurality of connecting interfaces match the plurality of vehicle lights, and wherein the sequence comprises a first period, for inspecting a first light of the group of adjacent or overlapping lights, wherein said power is supplied to the first light but not to any other adjacent or overlapping light of the group, and a second period, for inspecting a second light of the group of adjacent or overlapping lights, wherein said power is supplied to the second light but not to any other adjacent or overlapping light of the group.
2. The system of claim 1, wherein the sequence comprises an interval between the supply of the light-activating power to the first light and the supply of the light-activating power to the second light, optionally wherein the sequence com- prises supplying the light-activating power to a third, non-adjacent light during the interval.

3. The system of claim 1, wherein the sequence comprises an interval in which no light-activating power is supplied to the plurality of vehicle lights or the plurality of connecting interfaces, and/or wherein the sequence comprises concurrently supplying the light-activating power to all of the plurality of vehicle lights and all of the plurality of connecting interfaces, such that all of the plurality of vehicle lights and all of the plurality of connecting interfaces are supplied with the light-activating power during at least one period in the sequence.

4. The system of claim 1, wherein the controller is configured to deactivate the light testing mode in dependence on one or more deactivating conditions selected from: vehicle movement, parking brake off, ignition on, vehicle exterior lights on, hazard lights on, and time limit expired, and/or wherein the sequence comprises supplying the light-activating power to a respective one of the plurality of vehicle lights, concurrently with supplying the light-activating power to a respective one of the plurality of connecting interfaces.

5. The system of claim 1, wherein the sequence comprises supplying the light-activating power to each of the plurality of vehicle lights, concurrently with supplying the light-activating power to the associated plurality of connecting interfaces.

6. The system of claim 1, wherein the sequence comprises sequential supply of the light-activating power to the plurality of vehicle lights, such that a subset or one only of the plurality of vehicle lights and its associated connecting interface is supplied with the light-activating power during at least one period in the sequence.

7. The system of claim 1, wherein the sequence comprises sequentially supplying the light-activating power to a plurality of subsets of the plurality of vehicle lights and associated connecting interfaces, so that one subset and its associated connecting interface only is supplied with the light-activating power during at least one period in the sequence.

8. The system of claim 6, wherein the sequence comprises sequential supply of the light-activating power to the plurality of vehicle lights and associated connecting interfaces so that one vehicle light and its associated connecting interface only is supplied with the light-activating power during at least one period in the sequence.

9. The system of claim 1, wherein the plurality of vehicle lights comprise left and right groups in use and the sequence comprises sequential activation of the left and right groups of the plurality of vehicle lights, and/or wherein the system comprises a plurality of additional lights each connected to an associated one of the connecting interfaces of the system such that supply of light-activating power to the interface lights up the associated additional light.

10. A controller that controls supply of light-activating power to a plurality of vehicle lights, including a group of at least three adjacent or overlapping lights, to be matched by additional lights in use and to respective connecting interfaces associated with each of the vehicle lights, the controller being configured, in a light testing mode, to initiate supply of the light-activating power to each one of the plurality of vehicle lights and to an associated connecting interface during a respective period of a sequence for inspecting whether additional lights connected in use to the connecting interfaces match the plurality of vehicle lights, wherein the sequence comprises a first period, for inspecting a first light of the group of adjacent or overlapping lights, wherein said power is supplied to the first light but not to any other adjacent or overlapping light of the group, and a second period, for inspecting a second light of the group of adjacent or overlapping lights, wherein said power is supplied to the second light but not to any other adjacent or overlapping light of the group, optionally wherein the controller is configured to control supply of the light-activating power to the plurality of vehicle lights and the associated connecting interfaces in a system according to claim 1.

11. A vehicle comprising the lighting system of claim 1, optionally the vehicle having a trailer attached thereto to form a vehicle-trailer combination, and wherein the trailer comprises a plurality of additional lights each connected to an associated one of the connecting interfaces of the system such that supply of light-activating power to the interface lights up the associated additional lights.

12. A method of providing a light inspection function in a lighting system for use or when used in a vehicle, the lighting system comprising a plurality of vehicle lights, including a group of at least three adjacent or overlapping lights, to be matched by additional lights in use and respective connecting interfaces associated with each of the plurality of vehicle lights, the method comprising:

supplying light-activating power to each one of the plurality of vehicle lights and to an associated connecting interface during a respective period of a sequence for inspecting whether additional lights connected in use to the connecting interfaces match the plurality of vehicle lights, wherein said power is supplied to the first light but not to any other adjacent or overlapping light of the group, and a second period, for inspecting a second light of the group of adjacent or overlapping lights, wherein said power is supplied to the second light but not to any other adjacent or overlapping light of the group, optionally wherein the plurality of vehicle lights comprises first and second adjacent or overlapping lights and the sequence comprises an interval between supply of the light-activating power to the first and second lights.

13. The method of claim 12, wherein the sequence comprises supplying light-activating power to a third, non-adjacent light during the interval.

14. The method of claim 12, wherein the sequence comprises an interval in which no light-activating power is supplied to the plurality of vehicle lights or connecting interfaces, and/or wherein the sequence comprises concurrent supplying of the light-activating power to all of the plurality of vehicle lights and associated connecting interfaces, such that all of the plurality of vehicle lights and their associated connecting interfaces are supplied with the light-activating power during at least one period in the sequence.

15. The method of claim 12, wherein the method is ended in dependence on one or more deactivating conditions selected from: vehicle movement, parking brake off, ignition on, vehicle exterior lights on, hazard lights on, and time limit expired, and/or wherein the sequence comprises supplying the light-activating power to a vehicle light, concurrently with supplying the light-activating power to its associated connecting interface.

16. The method of claim 12, wherein the sequence comprises supplying the light-activating power to each of the plurality of vehicle lights, concurrently with supplying the light-activating power to the associated connecting interfaces.

17. The method of claim 12, wherein the sequence comprises sequentially supplying the light-activating power to the plurality of vehicle lights, such that a subset or one only of the plurality of vehicle lights and its associated connecting interface is supplied with the light-activating power during at least one period in the sequence.

18. The method of claim 12, wherein the sequence comprises sequentially supplying the light-activating power to a plurality of subsets of the plurality of vehicle lights and associated connecting interfaces, so that each subset and its associated connecting interface only is supplied with the light-activating power during at least one period in the sequence.

19. The method of claim 17, wherein the sequence comprises sequentially supplying the light-activating power to the plurality of vehicle lights and associated connecting interfaces so that each vehicle light and its associated connecting interface only is supplied with the light-activating power during at least one period in the sequence.

20. The method of claim 12, wherein the plurality of vehicle lights constitute left and right groups in use and the sequence comprises sequential activation of the left and right groups of the plurality of vehicle lights.

\* \* \* \* \*